(12) United States Patent
McIntyre et al.

(10) Patent No.: US 7,539,552 B2
(45) Date of Patent: May 26, 2009

(54) METHOD AND APPARATUS FOR IMPLEMENTING A UNIVERSAL COORDINATE SYSTEM FOR METROLOGY DATA

(75) Inventors: Michael G. McIntyre, Austin, TX (US); Zhuqing Zong, Round Rock, TX (US); Andrew Drozda-Freeman, Austin, TX (US); Vijay Sankaran, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/539,788

(22) Filed: Oct. 9, 2006

(65) Prior Publication Data

US 2008/0147222 A1     Jun. 19, 2008

(51) Int. Cl.
*G06F 19/00* (2006.01)
*G06F 17/50* (2006.01)
*G01R 31/26* (2006.01)

(52) U.S. Cl. ............... 700/108; 716/4; 438/14; 702/150

(58) Field of Classification Search ........... 700/108, 700/109, 121; 716/19, 4; 438/14; 702/1, 702/150; 430/30; 250/491.1; 356/399
See application file for complete search history.

(56) References Cited

U.S. PATENT DOCUMENTS

| | | | | |
|---|---|---|---|---|
| 5,773,836 A | * | 6/1998 | Hartley | 250/491.1 |
| 5,917,932 A | * | 6/1999 | Hartley | 382/144 |
| 2002/0035435 A1 | | 3/2002 | Ninomiya | 716/19 |
| 2003/0066035 A1 | | 4/2003 | Nagamura | 716/1 |
| 2005/0085940 A1 | * | 4/2005 | Griggs et al. | 700/181 |
| 2006/0190916 A1 | * | 8/2006 | Pike | 716/21 |
| 2007/0238201 A1 | * | 10/2007 | Funk et al. | 438/14 |

FOREIGN PATENT DOCUMENTS

JP     2001349848     12/2001

OTHER PUBLICATIONS

International Search Report Dated Mar. 6, 2008 for Application No. PCT/US07/020592.

* cited by examiner

*Primary Examiner*—Paul L Rodriguez
*Assistant Examiner*—Sheela Rao
(74) *Attorney, Agent, or Firm*—Williams, Morgan & Amerson, P.C.

(57) ABSTRACT

A method includes receiving a metrology report including metrology data collected by a metrology tool, position data associated with the metrology data, and context data associated with the metrology tool. A first coordinate system employed by the metrology tool is determined based on the context data. The position data is transformed from the first coordinate system to a second coordinate system to generate transformed position data. The transformed position data is associated with the metrology data.

22 Claims, 9 Drawing Sheets

METHOD AND APPARATUS FOR IMPLEMENTING A UNIVERSAL COORDINATE SYSTEM FOR METROLOGY DATA

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

The present invention relates generally to semiconductor manufacturing and, more particularly, to method and apparatus for implementing a universal coordinate system for metrology data.

Technology advancements in the manufacturing industry have resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (e.g., patterning, etching, doping, ion implanting, etc.), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using a patterned layer of photoresist as a mask. This etching process results in the formation of various features or objects in the process layer. Such features may be used as, for example, a gate electrode structure for a transistor, a conductive line, or an isolation structure.

Designers place certain features at specific locations on each device to achieve the desired electrical function. These features are fabricated on to optical templates called "reticles". Reticles are capable of producing a two dimensional pattern that can be printed onto a photosensitive surface using light of the appropriate wavelength. Many reticles contain a repeated pattern of the device laid out in a regular array. The space between each device pattern, sometimes referred to as a scribe line, is often used to place patterns of structures that aid in the test and measurement of the wafers produced. The image of the pattern on the reticle is produced on the wafer by shining light through each such multi-device reticle. This illumination process is often called a "flash". Depending on the application, a single flash may encompass any desired number of individual die. Multiple flash or illumination processes are performed across the surface of the wafer so that all die on the wafer are subject to this process.

Three-dimensional features are obtained through an intricate sequence of steps that build a single two-dimensional layer at a time. The position of the features at each layer are different but are related to each other. Measurements and tests of different features on different flashes/dies are important to ascertaining the stability of the manufacturing process and its uniformity across each wafer 100.

FIG. 1 illustrates a wafer map of a typical semiconductor wafer 100. Each wafer 100 can accommodate a number of flashes (and by derivation, a number of devices) usually through a Cartesian grid layout 110 called a stepping pattern. In the illustrative embodiment depicted in FIG. 1, a so-called 3×2 flash pattern is depicted wherein six die are exposed in a single flash. Of course, as indicated above, the number of die in a single flash may vary depending upon the application. The equipment that subjects each wafer to this photolithographic process is called a stepper. The device that is formed on the surface of a wafer is called a die 120. A notch 130 is provided for aligning the wafer 100 in a particular tool. Other features may be used for alignment, such as a flat edge portion.

Data is collected at various steps during the manufacturing process to ensure conformance to production standards. This data may include performance data, such as the yield of the wafer 100 (i.e., which die 120 are functional), the speed of each die 120, the power consumption of each die 120, etc. This data may also include metrology data relating the fabrication of the wafer, such as process layer thickness, critical dimensions, etc.

Finally, after the wafer processing is complete, the wafers 100 are diced into chips that are then encased inside plastic or ceramic packages with metal leads that can be used to attach the chips to other electrical circuits such as printed circuit assemblies. A complex mapping exists between the features that were fabricated into each chip and the signals provided at each metal lead. The mapping gets exercised each time electrical current is applied to specific leads. When a chip fails to perform its electrical function, the failure can mostly be attributed to this complex sequence of structures. Analyzing the cause for failures thus becomes an exercise in correlating data spatially. Further, since the physical confirmation of the failed structure can only be established through expensive analytical techniques like Atomic Force Microscopy, it is important to have a high degree of confidence in localizing the area of failure.

Hence, the metrology data collected on the wafer 100 has spatial significance. In other words, it is useful to know the location on the wafer 100 where the metrology data was collected. Various metrology tools use different coordinate systems for specifying location. For example, a rectangular coordinate system may be defined with a designated origin 140. For instance, the origin 140 may be located at the center of the wafer 100. Other coordinate systems may use an origin not located on the wafer 100 or at a different position on the wafer 100. Such coordinateness systems may be Cartesian or radial. Metrology tools from different manufacturers may have different coordinate systems.

The metrology recipe may also have an effect on the relationship between the coordinates provided by the metrology tool and the actual location on the wafer 100. Certain metrology tools are more efficient if they traverse a wafer 100 in a certain direction. To increase throughput, the wafer 100 is rotated to align the measurement sites with the preferred direction. The metrology tool outputs the measurement coordinates in units that are not dependent on the rotational position of the wafer 100. Hence, location data from two different wafers 100 positioned at different rotational positions does not correspond to the same physical locations of the respective wafers. Other metrology tools do not report coordinates at all, but rather, only a reading order with no reference to physical wafer locations.

The complexities of wafer fabrication introduce several challenges to the effective utilization of metrology data in a system with inconsistent coordinate systems. Due to the variation in coordinate systems employed, it is difficult to correlate metrology data to specific positions on a wafer. Hence, it is more difficult to identify yield issues and adjust the process to improve results. This slower response results in longer manufacturing ramp times and potentially decreased profitability.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes receiving a metrology report including metrology data collected by a metrology tool, position data associated with the metrology data, and context data associated with the metrology tool. A first coordinate system employed by the metrology tool is determined based on the context data. The position data is transformed from the first coordinate system to a second coordinate system to generate transformed position data. The transformed position data is associated with the metrology data.

Another aspect of the present invention is seen a system including a metrology tool, a coordinate translation unit, and a data store. The metrology tool is operable to collect metrology data. The coordinate translation unit is operable to receive a metrology report including the metrology data, position data associated with the metrology data, and context data associated with the metrology tool. The coordinate translation unit is operable to determine a first coordinate system employed by the metrology tool based on the context data, transform the position data from the first coordinate system to a second coordinate system to generate transformed position data, and associate the transformed position data with the metrology data. The data store is operable to store the metrology data and the associated transformed position data.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
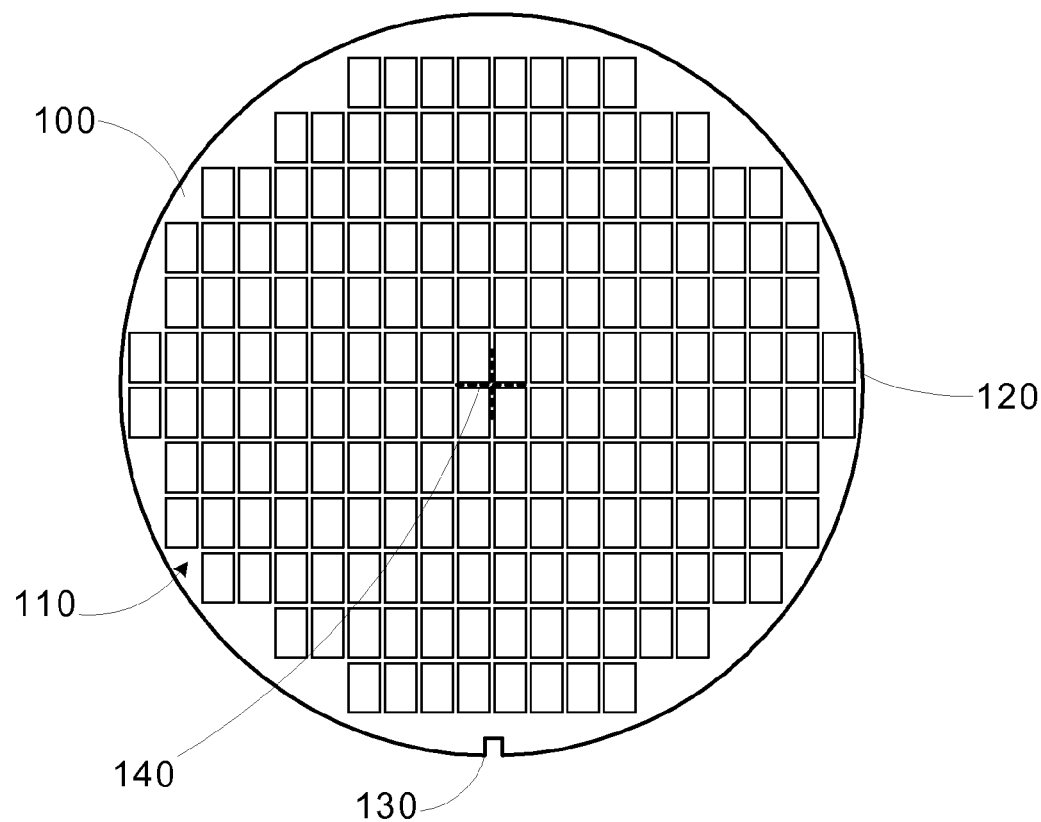
FIG. 1 is a diagram of an illustrative wafer map.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or CDROM), and may be read only or random access. Similarly, the transmission medium may be twisted wire pairs, coaxial cable, optical fiber, wireless or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
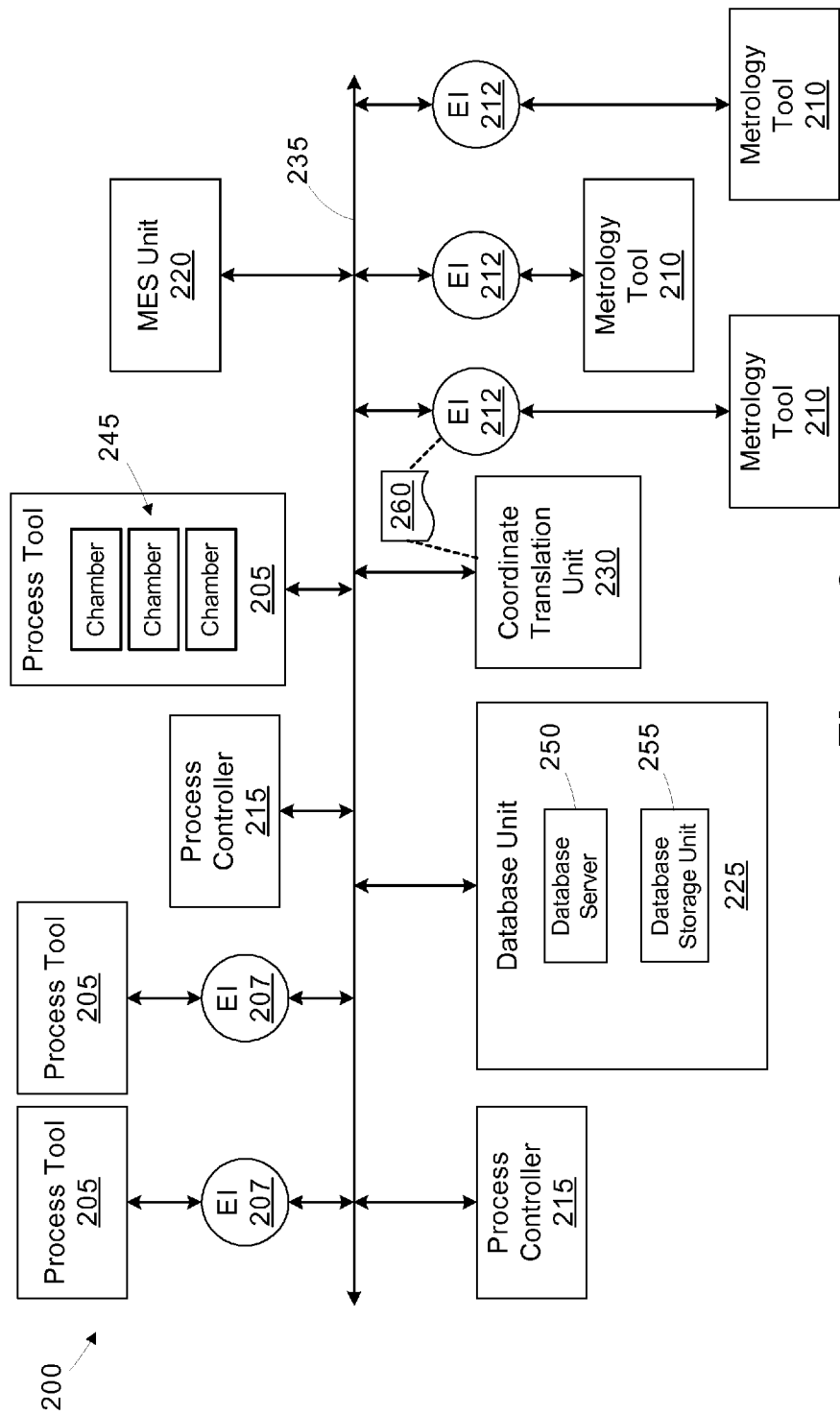
FIG. 2 is a simplified block diagram of a manufacturing system in accordance with one embodiment of the present invention.

Referring now to the drawings wherein like reference numbers correspond to similar components throughout the several views and, specifically, referring to FIG. 2, the present invention shall be described in the context of an illustrative manufacturing system 200. The manufacturing system 200 includes process tools 205, metrology tools 210, process controllers 215, a manufacturing execution system (MES) unit 220, a database unit 225, a coordinate transformation unit 230, and a network 235. As described in greater detail below the coordinate transformation unit 230 processes metrology data to format the data in accordance with a universal coordinate system (UCS). The various entities in the manufacturing system 200 may be implemented using software components, hardware components, firmware components, and/or a combination thereof.

In the illustrated embodiment, the manufacturing system 200 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items, including, but not limited to, microprocessors, memory devices, digital signal processors, application specific integrated circuits (ASICs), or other devices. The techniques may also be applied to workpieces or manufactured items other than semiconductor devices. Generally, the techniques may be applied to any type of measured data to allow conversion of continuous data into a binary format.

The entities in the manufacturing system 200 communicate within a manufacturing framework or a network 235 of processing modules. The network 235 interconnects various components of the manufacturing system 200, allowing them to exchange information. To facilitate communication with the network 235, the process tools 205 may have associated equipment interfaces 207, and the metrology tools 210 may have associated equipment interfaces 212. The equipment interfaces 207, 212 serve as a bridge between the associated tool 205, 210 and the network 235 to translate commands and data from the tool specific protocol to a network protocol. Although shown as separate entities, the equipment interfaces 207, 212 may be integrated into the respective tools 205, 210.

A particular wafer or lot of wafers progresses through the process tools 205 as it is being manufactured, with each tool 205 performing a specific function in the process flow. Some of the process tools 205 may include a plurality of chambers 245, each of which may process wafers and may be controlled collectively or individually. Exemplary process tools 205 for a semiconductor device fabrication environment include photolithography steppers, etch tools, deposition tools, polishing tools, rapid thermal processing tools, implantation tools, etc. An actual implementation of the manufacturing system 200 includes many more process tools 205 than those illustrated in FIG. 2, and typically multiple tools of each type are present.

Exemplary metrology tools 210 include, but are not limited to, film measurement devices, scanning electron microscopes, optical review tools, electrical test tools, etc. Again, an actual implementation includes many metrology tools 210. The metrology tools 210 may measure various parameters associated with the processing of the wafers in the manufacturing system 200, including physical data regarding the processed wafers, such as feature dimensions, process layer thickness, surface profile, etc., or performance data, such as speed, yield, power consumption, etc.

The process controllers 215 determine control actions to control various operations of selected process tools 205 which may be based, at least in part, on metrology data collected by the metrology tools 210 during the fabrication of wafers. The particular control models used by the process controllers 215 depend on the type of process tool 205 being controlled, and the particular metrology data collected for use in conjunction with the control models depends on the feature being formed by the particular process tool 205. The control models may be developed empirically using commonly known linear or non-linear techniques. The control models may be relatively simple equation-based models (e.g., linear, exponential, weighted average, etc.) or more complex models, such as a neural network model, a principal component analysis (PCA) model, or a partial least squares projection to latent structures (PLS) model. The specific implementation of the control models may vary depending on the modeling techniques selected and the process being controlled. The selection and development of the particular control models is within the ability of one of ordinary skill in the art, and accordingly, the control models are not described in greater detail herein for clarity and to avoid obscuring the instant invention.

An exemplary process control scenario involves the control of a gate electrode critical dimension (CD) in a transistor structure. Various processes and process variables may be controlled to affect the gate electrode CD. For example, a photoresist mask is used in a photolithography tool to pattern the gate electrode. The photolithography processes used to form the mask may affect the dimensions of the pattern and thus the dimensions of the gate electrode formed by an etch process using the mask. Exposure time and energy may be controlled to affect the dimensions of the mask. The parameters (e.g., etch time, plasma power, etch gas makeup and concentration, etc.) of the etch process may also affect the CD of the completed gate electrode and may be controlled by a process controller 215. The processes and variables described above that affect the gate electrode CD are not exhaustive. Other processes may be performed that have an impact of the CD and other variables of those processes may be controlled.

The MES unit 220 directs the high level operation of the manufacturing system 200. The MES unit 220 monitors the status of the various entities in the manufacturing system 200 (i.e., lots, tools 205, 210). The database unit 225 is provided for storing a plurality of types of data, such as manufacturing-related data (e.g., pre-process and post process metrology data), data related to the operation of the system 200 (e.g., the status of the tools 205, 210 the status and priorities of semiconductor wafers 100, etc.). The database unit 225 may store tool state data relating to a plurality of process runs performed by the process tools 205. The database unit 225 may include a database server 250 for storing tool state data and/or other manufacturing data related to processing of wafers 100 into a database storage unit 255.

The MES unit 220 stores information in the database unit 225 related to the particular tools 205, 210 (i.e., or sensors (not shown) associated with the tools 205, 210) used to process each lot of wafers. Sensor data stored for the process tools 205 may include chamber pressure, chamber temperature, anneal time, implant dose, implant energy, plasma energy, processing time, etc. Data associated with the operating recipe settings used by the process tool 205 during the fabrication process may also be stored in the database unit 225. For example, it may not be possible to measure direct values for some process parameters. These settings may be determined from the operating recipe in lieu of actual process data from the process tool 205.

The coordinate transformation unit 230 is provided for receiving metrology data from the metrology tools 210 and transforming the coordinates provided with the measurements to correspond to a universal coordinate system (UCS). Generally, the coordinate transformation unit uses data associated with the tool and recipe to determine the appropriate transformation algorithm. To accomplish the transformation, a wafer map standard is defined that distinctly identifies flash, die, and point coordinates for each mask set as it gets patterned on the wafer. Exemplary coordinate systems are defined in SEMI M20, entitled "PRACTICE FOR ESTABLISHING A WAFER COORDINATE SYSTEM" and SEMI M21, entitled "GUIDE FOR ASSIGNING ADDRESSES TO RECTANGULAR ELEMENTS IN A CARTESIAN ARRAY", the latest versions of which at the time of the filing of this patent application are incorporated herein by reference in their entireties.

Figure 3:
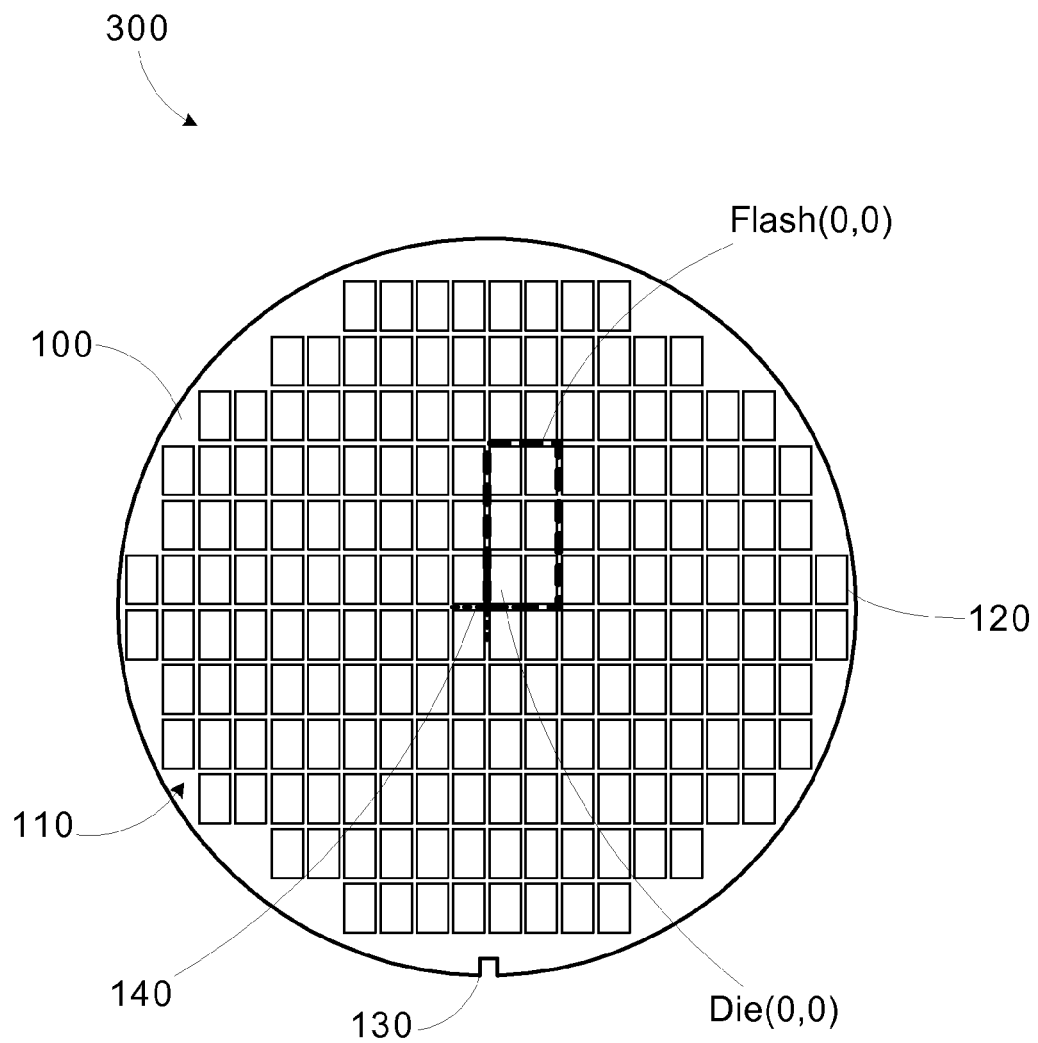
FIG. 3 is a diagram of a universal coordinate system wafer map used in the system of FIG. 2.

In the illustrated embodiment, the UCS wafer map 300 shown in FIG. 3, is defined with the notch (e.g., the notch 130 in FIG. 1) or flat oriented at the bottom, and the center of the wafer defines the origin 140 of the coordinate system with the positive X-axis being horizontal and going to the right and positive Y-axis being vertical and going upwards (i.e., as illustrated by the origin 140 in FIG. 1). All point coordinates may be specified in units of microns (i.e., micrometers), or any other desired unit of measurement. Additionally, Flash(0, 0) is defined by the flash that contains the center of the wafer and Die(0,0) represents the lower left die within the Flash(0, 0). All the other Flashes and Dies are numbered in a grid layout in accordance with their position on the X and Y-axes.

The coordinate transformation unit 230 may store data in the database storage unit 255 specifying the relationship between the flash and die locations. As seen in FIG. 2, the equipment interface 212 generates a metrology report 260 for a metrology event. The metrology report 260 is routed over the network 235 to the coordinate transformation unit 230 for processing. The metrology report 260 includes the measurement values, the locations of the measurements as reported by the metrology tool 210, and the measurement recipe. Based on context data including the metrology tool ID and/or the recipe ID, the coordinate transformation unit 230 identifies a necessary coordinate transformation for the measurement locations to transform the coordinates into UCS coordinates.

Figure 4:
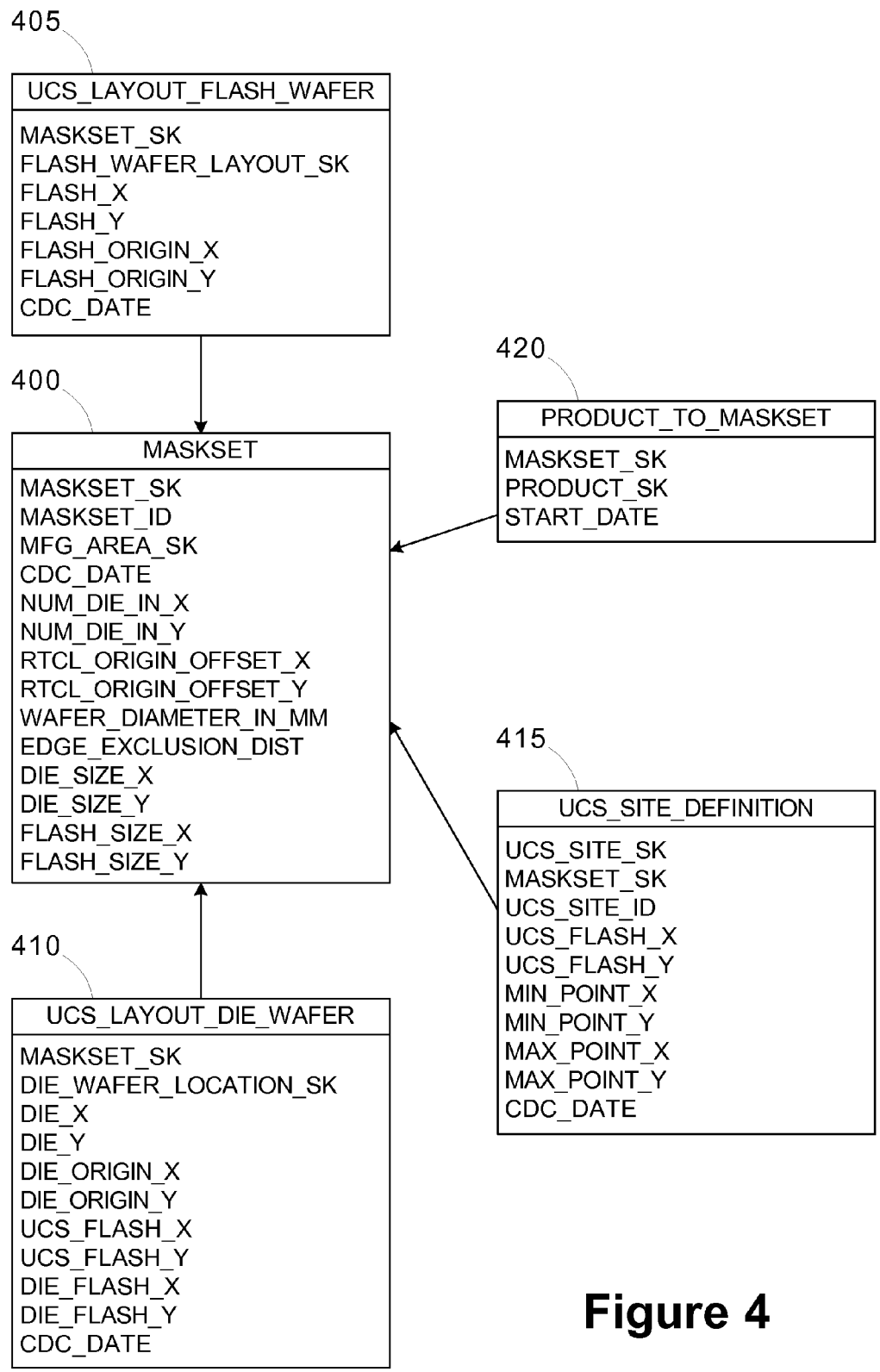
FIGS. 4, 5A and 5B are diagrams illustrating data structures used by a coordinate transformation unit in the system of FIG. 2.
Figure 5A:
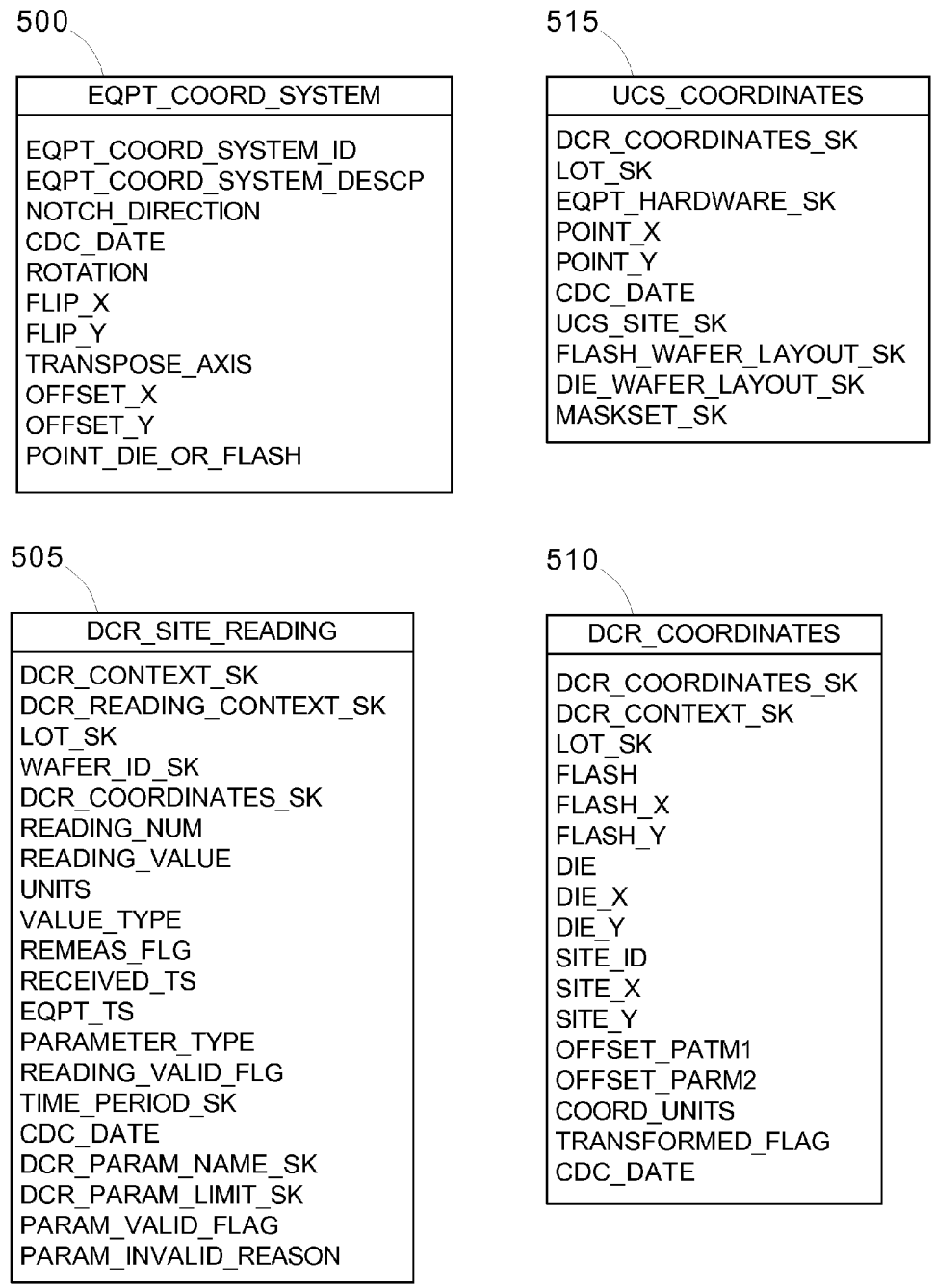
Figure 5B:
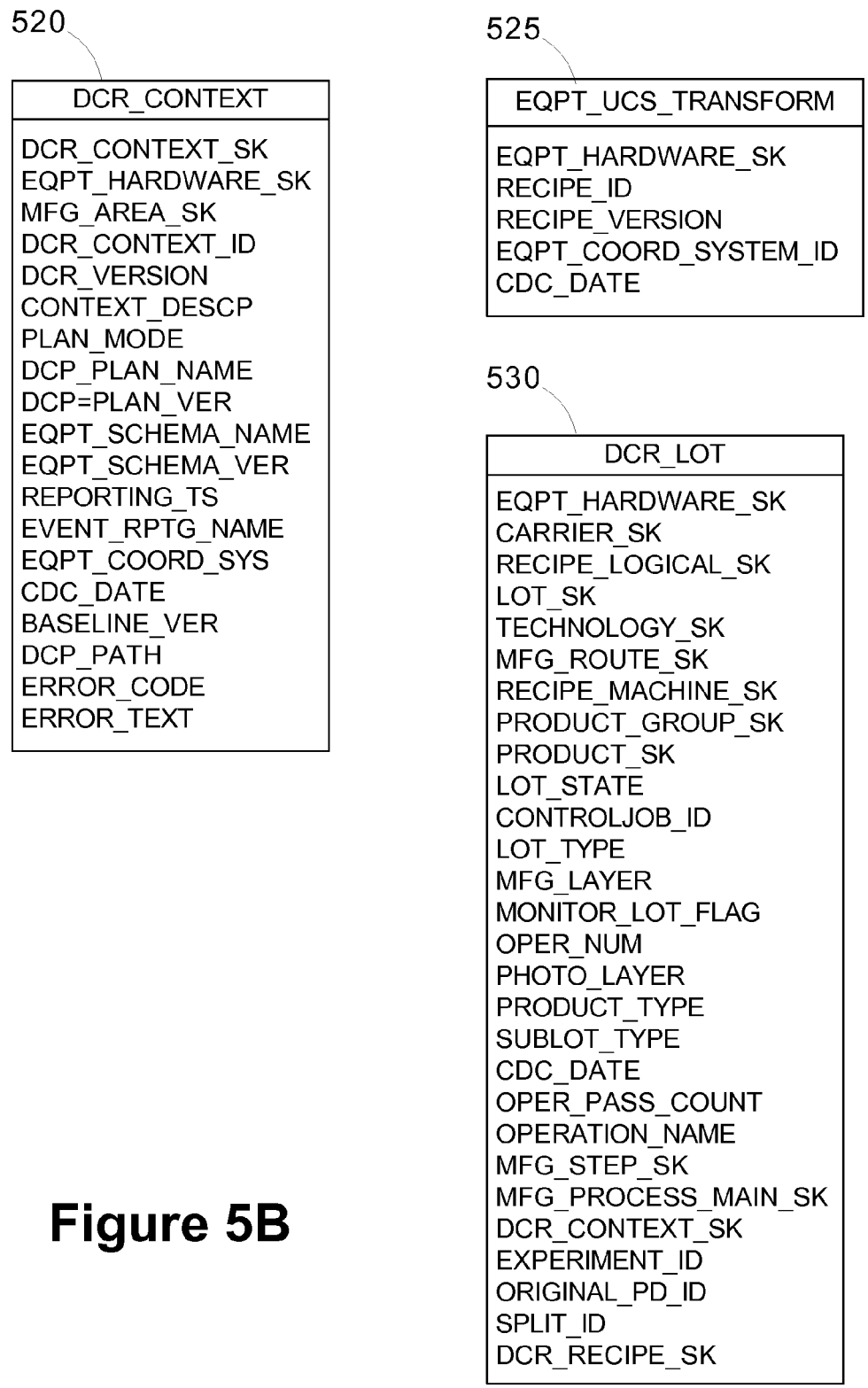

Turning now to FIGS. 4, 5A, and 5B, diagrams illustrating data tables used by the coordinate transformation unit 230 are provided. A MASKSET table 400 may be used to identify each distinct pattern of the dies 120 as exposed on the wafer 100. Each set of masks (i.e., also known as a reticle set) can be uniquely identified by a MASKSET ID (or RETICLE SET ID). The MASKSET table 400 associates the number of die 120 in the horizontal and vertical directions, the offset of the reticle from the center 140 of the wafer 100, die and flash sizes in each direction, the diameter of the wafer 100 and the edge exclusion distance with each MASKSET_ID. The manufacturing area for each mask set is also available to enable differentiation of mask sets from different fabrication facilities. One key for the MASKSET table is a composite formed from {MASKSET_ID, MFG_AREA_SK, WAFER_DIAMETER_IN_MM, FLASH_SIZE_X, FLASH_SIZE_Y, NUM_DIE_IN_X, NUM_DIE_IN_Y, RTCL_ORIGIN_OFFSET_X, RTCL_ORIGIN_OFFSET_Y}.

Note that for every different value of the reticle offset from the center 140 of the wafer 100, the resulting wafer map could be different for the same MASKSET. Similarly, if the flash size is altered or the number of die 120 in either direction is changed, the resulting pattern on the wafer would be different. If all else remains the same and only the WAFER_DIAMETER is different, the data should be construed as different since the wafer map for a 200 mm wafer may not be complete when superimposed on a 300 mm wafer.

The explicit representation of the rectangular regions on the wafer 100 for each flash are persisted in a table UCS_LAYOUT_FLASH_WAFER 405. This table 405 includes FLASH_X and FLASH_Y, which are the coordinates of the flash per UCS. The lower left corner of each flash is recorded as FLASH_ORIGIN_X and FLASH_ORIGIN_Y. All these columns are with reference to a specific MASKSET and that relationship is established through the MASKSET_SK. One key is a composite formed as {MASKSET_SK, FLASH_X, FLASH_Y} that supports each unique FLASH_WAFER_LAYOUT_SK.

The explicit representation of the rectangular regions on the wafer 100 for each die 120 are persisted in a table UCS_LAYOUT_DIE_WAFER 410. This table 410 includes DIE_X, DIE_Y which are the coordinates of the die 120 per UCS. The lower left corner of each die 120 is recorded as DIE_ORIGIN_X and DIE_ORIGIN_Y. Further, each die 120 is located within a specific Flash(X,Y) on that wafer map, and the columns UCS_FLASH_X, UCS_FLASH_Y identify that flash. Additionally, the local coordinate numbering for the die 120 within each flash can take (0,0) . . . (m,n) depending on how many die 120 are in either direction within each MASK. This coordinate is captured in the table as DIE_FLASH_X, DIE_FLASH_Y. All these columns are with reference to a specific MASKSET and that relationship is established through the MASKSET_SK. The key is a composite formed as {MASKSET_SK, DIE_X, DIE_Y} that supports each unique DIE_WAFER_LAYOUT_SK.

In some embodiments, metrology plans for collecting wafer electrical test (WET) data declare specific site numbers for every flash that will be part of the overall tests. These sites are usually distributed across the wafer to obtain good spatial statistics through sampling measurements at different points on the wafer. The specific site numbers are tied in to the UCS system through a table called UCS_SITE_DEFINITION 415. A column called UCS_SITE_ID declares the specific site number for that product or mask set. This model has been designed to support generic rectangular regions that may or may not overlap fully with a single flash. The columns MIN_POINT_X, MAX_POINT_X, MIN_POINT_Y, MAX_POINT_Y define such a region for each row in the table. In cases where the region corresponds exactly with particular Flash(X,Y) the values (X,Y) are recorded in the columns UCS_FLASH_X and UCS_FLASH_Y. All these columns are with reference to a specific MASKSET and that relationship is established through the MASKSET_SK. The primary key is a composite formed as {MASKSET_SK, UCS_SITE_ID} that supports each unique UCS_SITE_SK.

Finally, a table PRODUCT_TO_MASKSET 420 provides a link between PRODUCT_ID and MASKSET_ID, serving as the gateway to the wafer map for each lot/wafer 100 produced. It is assumed that every product will have its own mask set and therefore its own specific pattern on the wafers 100 used to produce that device.

The above model supports very rapid determination of the Flash(x,y) or Die(x,y) for every point on the surface of the wafer. Assuming a Point(x,y) is expressed in SEMI M20 notation, with the center of the wafer as its origin and the notch/flat pointing downwards, and the mask set for the measured wafer is specified, the corresponding flash(x,y) can be retrieved by the following query:

```
select FLASH_X, FLASH_Y
from UCS_LAYOUT_FLASH_WAFER flash, MASKSET m
where Point(X) >= flash.FLASH_ORIGIN_X
and Point(X) < flash.FLASH_ORIGIN_X + m.FLASH_SIZE_X
and Point(Y) >= flash.FLASH_ORIGIN_Y
and Point(Y) < flash.FLASH_ORIGIN_Y + m.FLASH_SIZE_Y
```

Similarly, Die(x,y) can be retrieved by the following query:

```
select DIE_X, DIE_Y
from UCS_LAYOUT_DIE_WAFER DIE, MASKSET m
where Point(X) >= DIE.DIE_ORIGIN_X
and Point(X) < DIE.DIE_ORIGIN_X + m.DIE_SIZE_X
and Point(Y) >= DIE.DIE_ORIGIN_Y
and Point(Y) < DIE.DIE_ORIGIN_Y + m.DIE_SIZE_Y
```

The model also enables usage of FLASH_WAFER_LAYOUT_SK or DIE_WAFER_LAYOUT_SK as dimensions thereby facilitating seamless overlay of results from inline metrology, WET, SORT, and CLASS.

Turning now to FIG. 4A, the master data for equipment coordinate systems is maintained in a table called EQPT_COORD_SYSTEM 500. This table 500 declares an ID for each Coordinate System defined by the unique collection of {NOTCH_DIRECTION, ROTATION, FLIP_X, FLIP_Y, TRANSPOSE_AXIS, OFFSET_X, OFFSET_Y, POINT_DIE_OR_FLASH} The NOTCH_DIRECTION states the position of the wafer notch/flat. Allowed Values are 0,1,2,3 referring to Bottom, Right, Top, and Left, respectively. ROTATION indicates the number of 90 degree increments in a counter-clockwise direction that the wafer has been rotated. Allowed values are 0, 1, 2, 3 with a default of 0. FLIP_X indicates that the X-Axis has been flipped (i.e., the positive X is now negative X and vice versa). Allowed values are 1 denoting no flip and −1 denoting a flip. FLIP_Y indicates that the Y-Axis has been flipped. Allowed values are 1 denoting no flip and −1 denoting a flip. TRANSPOSE_AXIS states that the axes have been interchanged (i.e., the old X axis is the new Y axis and the old Y axis is the new X axis). Allowed values are 0 denoting no transpose and 1 denoting a transpose. OFFSET_X declares the distance that the origin of the coordinate system is shifted in the X direction from the origin of the wafer. This is stated relative to the rest of the above fields and has units. OFFSET_Y declares the distance that the origin of the coordinate system is shifted in the Y direction from the origin of the wafer. POINT_DIE_OR_FLASH declares the unit of the coordinate system. Allowed values are P denoting Point coordinates, D denoting Die coordinates, and F denoting Flash coordinates. Note that Point coordinates are stated in microns while the other two coordinates are unsigned integers. The OFFSET_X and OFFSET_Y values are expressed in units consistent with the coordinate system specified by the POINT_DIE_OR_FLASH value.

A metrology record collected in the manufacturing system 200 and stored in the database storage unit 255 includes both the value of the measured parameter and its associated position on the wafer 100. When the metrology tool 210 cannot report the point coordinates, either the die or flash coordinates are collected as the metrology tool 210 reports them. The measurement values that have any associated coordinate information are stored in a table 505 called DCR_SITE_READING and the collected coordinates are written to a table 510 called DCR_COORDINATES. The acronym "DCR" signifies Data Collection Report. Multiple measurements at the same point will result in a single entry in the DCR_COORDINATES table 510 but multiple entries in the DCR_SITE_READING table 505. The coordinates provided by the metrology tool 210 are transformed by the coordinate transformation unit 230 to the UCS notation. In the illustrated embodiment, the coordinate transformation unit 230 loads the transformed values to a separate table 515 called UCS_COORDINATES to allow the preservation of the raw data while simultaneously linking it to the transformed data.

Every row in DCR_COORDINATES 510 is associated with a specific DCR_CONTEXT_SK and this can be used to join with a DCR_CONTEXT table 520 to determine the coordinate system used by the equipment (i.e., as recorded by EQPT_COORD_SYS column of the DCR_CONTEXT table 520) during collection of the data. When the EQPT_COORD_SYS column does not indicate a valid value, the system reverts to an EQPT_UCS_TRANSFORM table 525. Using the EQPT_HARDWARE_SK from DCR_CONTEXT to join with this table 525, a value in the column EQPT_COORD_SYSTEM_ID is retrieved, which corresponds to the coordinate system used by all recipes run on that particular equipment.

Every row in DCR_COORDINATES 510 is also associated with a specific DCR_LOT_SK, which can be used to join with a DCR_LOT table 530 to determine the PRODUCT_SK of the LOT as it was being measured at the metrology tool. This PRODUCT_SK can be used to join with the PRODUCT_TO_MASKSET table to determine the MASKSET_SK associated with the measurement. Knowing the EQPT_COORD_SYS and the MASKSET_SK, each measured point on the wafer can be transformed to UCS coordinates while also calculating the UCS Die, Flash and Site to which the measured point belongs.

Figure 6A:
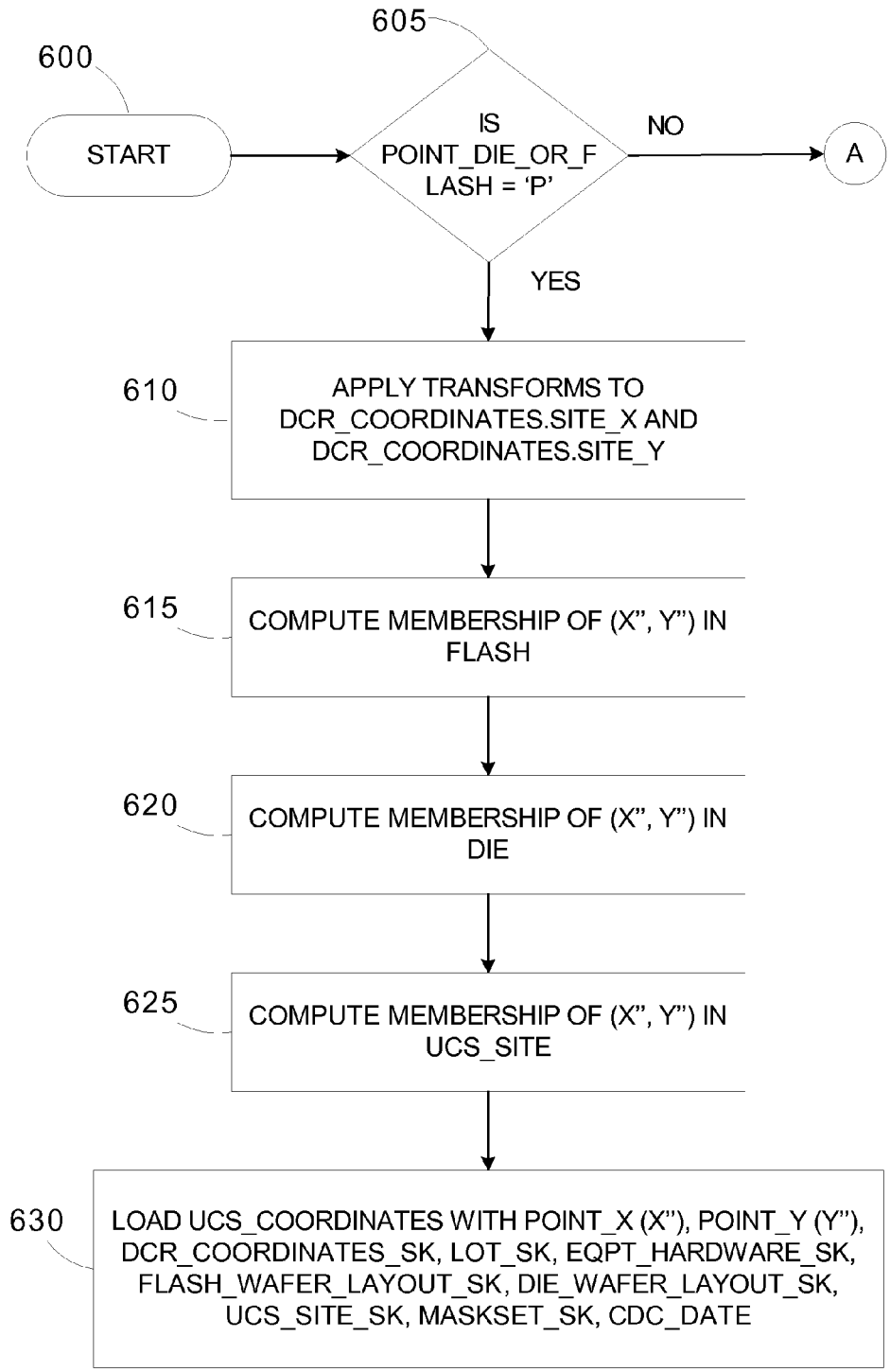
FIGS. 6A, 6B, 6C illustrate a simplified flow diagram of a method for transforming coordinates in accordance with another illustrative embodiment of the present invention.
Figure 6B:
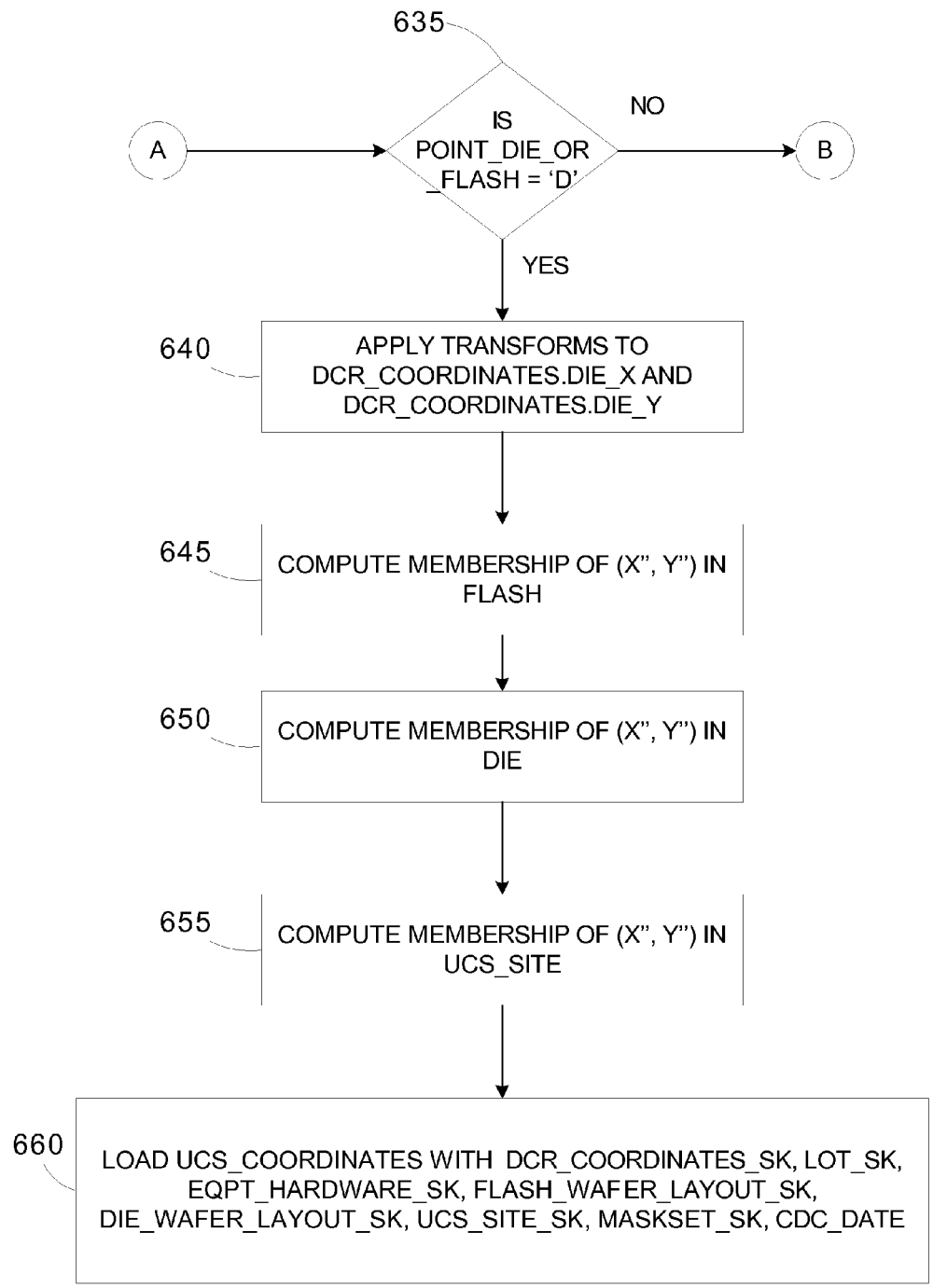
Figure 6C:
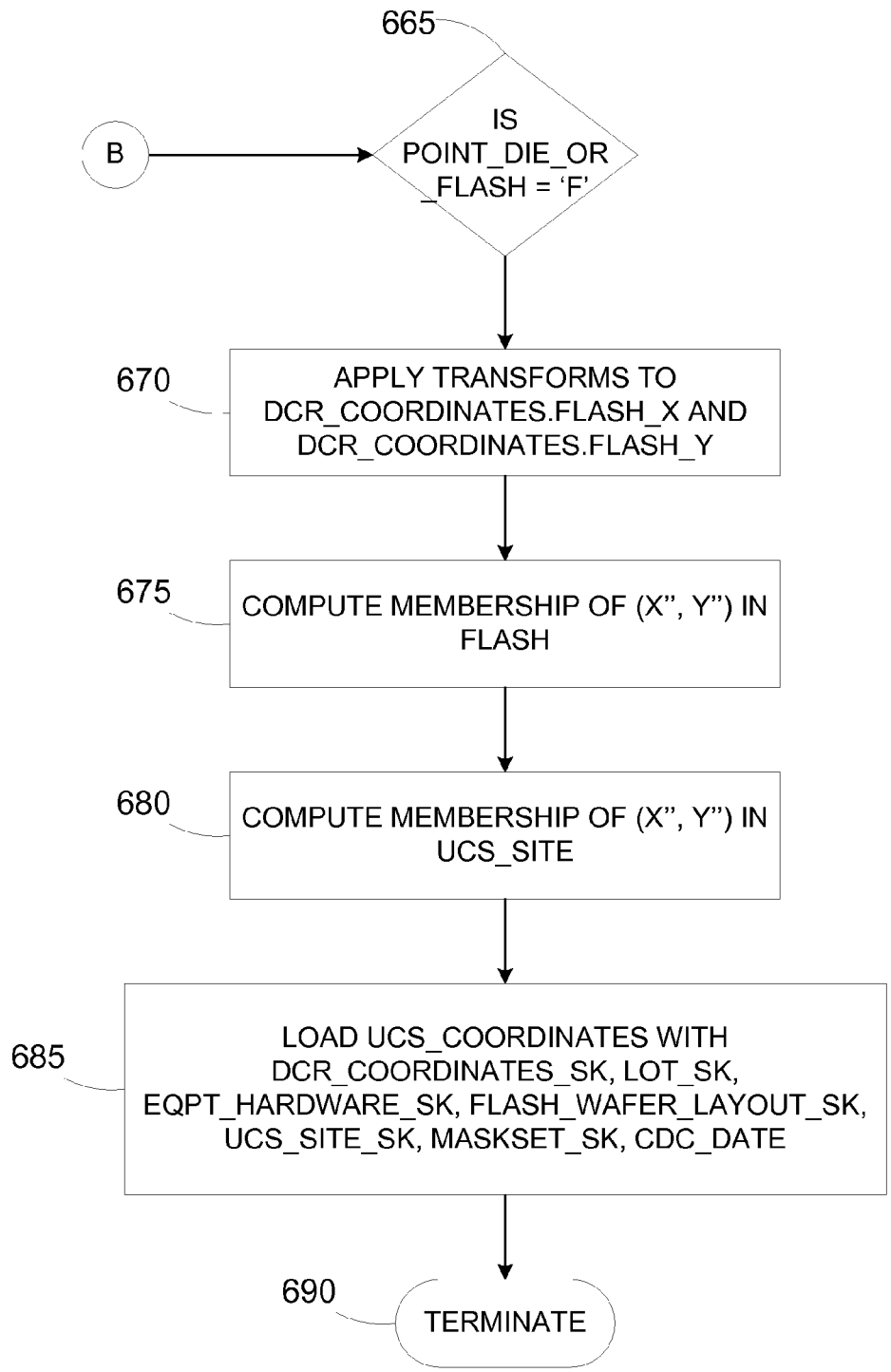

FIGS. 6A, 6B and 6C illustrate an exemplary flow diagram of a method for transforming the coordinates from the tool coordinate system to a UCS denotation. Generally, transformations are implemented using the following equations:

If TRANSPOSE=1 then apply X'=Y and Y'=X else apply X'=X and Y'=Y.

X''=OFFSET_X+X'*FLIP_X

Y''=OFFSET_Y+Y'*FLIP_Y

The values for the transpose, offset, and flip parameters are included in an entry in the EQPT_COORD_SYSTEM table 500 for the particular metrology tool 210.

The method starts in method block 600 when a metrology report 260 is received. In method block 605, it is determined if the measurement locations output by the metrology tool 210 are specified in point coordinates. If point coordinates are specified, point transforms are applied to the DCR site X and site Y coordinates in method block 610 based on the EQPT_COORD_SYSTEM data for the associated metrology tool 210. In method blocks 615, 620, and 625 the flash, die, and site memberships of the point are determined, respectively. In method block 630, the UCS_COORDINATES table 515 is loaded with the transformed UCS metrology coordinate data.

If the metrology locations are not specified in point coordinates in method block 605, the method transitions to method block 635 (see FIG. 6B) where it is determined if the measurement locations output by the metrology tool 210 are specified in die coordinates. If die coordinates are specified, transforms are applied to the DCR die X and die Y coordinates in method block 640. In method blocks 645, 650, and 655 the flash, die, and site memberships of the die are determined, respectively. In method block 660, the UCS_COORDINATES table 515 is loaded with the transformed UCS metrology coordinate data.

If the metrology locations are not specified in die coordinates in method block 635, the method transitions to method block 665 (see FIG. 6C) where it is determined if the measurement locations output by the metrology tool 210 are specified in flash coordinates. Since, the only valid values for the coordinates are point, die, or flash, method block 665 will always evaluate as being true, unless the record is invalid. Transforms are applied to the DCR flash X and flash Y coordinates in method block 670. In method blocks 675 and 680, the flash and site memberships are determined, respectively. In method block 685, the UCS_COORDINATES table 515 is loaded with the transformed UCS metrology coordinate data, and in method block 690, the method terminates.

Metrology data in the DCR_COORDINATES table 510 that correspond to products for which mask sets have not been defined or mask sets that have not been approved, or data that is measured using tools 210 that have not been associated with any equipment coordinate system are not transformed. An exception report may be sent to an engineer to allow the appropriate coordinate system specification to be made, and the data may be transformed by the coordinate transformation unit 230 following such action.

Although the previous examples illustrate the coordinate transformation functionality embodied in a separate coordinate transformation unit 230, it is contemplated that this functionality may be incorporated into other entities in the manufacturing system 200. For example, the transformation functionality may be incorporated into the equipment interfaces 212.

The implementation universal coordinate system described herein provides numerous advantages. The coordinates of the measured/tested location may be reported in a universal format, independent of the coordinate system used by the metrology tool 210 during the data collection. Variations in the coordinate systems used between different recipes on the same data collection equipment may be addressed and the coordinates may be reconciled. The notch position employed during different modes of operation for test tools may be considered when transforming the coordinates. Finally, the exact coordinates of the boundary of each die within a flash may be represented without requiring the combining of data from the stepper with data from the reticle shop.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   receiving a metrology report including metrology data collected by a metrology tool, position data associated with the metrology data, and context data associated with the metrology tool and identifying a type of metrology process employed by the metrology tool;
   determining a first coordinate system employed by the metrology tool based on the context data by accessing a database storing a plurality of coordinate systems indexed by the type of metrology process;
   transforming the position data from the first coordinate system to a second coordinate system to generate transformed position data; and
   storing the transformed position data and the metrology data in a data store and associating the transformed position data with the metrology data.

2. The method of claim 1, further comprising controlling a process tool based on the metrology data and the associated transformed position data.

3. The method of claim 1, wherein the context data includes a metrology tool identifier.

4. The method of claim 1, wherein the context data includes a recipe identifier associated with a recipe used by the metrology tool to collect the metrology data.

5. The method of claim 1, wherein determining the first coordinate system further comprising identifying parameters of the first coordinate system, the parameters comprising at least one of a notch direction parameter, a rotation parameter, a flip parameter, a transpose parameter, and an offset parameter.

6. The method of claim 1, wherein the metrology report is associated with a semiconductor wafer, further comprising:
   identifying a mask set associated with the semiconductor wafer;
   determining a wafer map associated with the mask set, the wafer map defining a plurality of flash sites and a plurality die locations within each flash sites;
   determining a flash site from the plurality of flash sites including the transformed position data; and determining a die location from the plurality of die locations including the transformed position data.

7. The method of claim 1, wherein transforming the position data further comprises transposing X and Y coordinates of the first coordinate system.

8. The method of claim 1, wherein transforming the position data further comprises adding an offset to at least one of an X coordinate and a Y coordinate of the first coordinate system.

9. The method of claim 1, wherein transforming the position data further comprises flipping at least one of an X coordinate and a Y coordinate of the first coordinate system.

10. The method of claim 1, wherein transforming the position data further comprises rotating the first coordinate system.

11. A system, comprising:
a metrology tool operable to collect metrology data;
a coordinate translation unit operable to receive a metrology report including the metrology data, position data associated with the metrology data, and context data associated with the metrology tool and identifying a type of metrology process employed by the metrology tool, determine a first coordinate system employed by the metrology tool based on the context data by accessing a database storing a plurality of coordinate systems indexed by the type of metrology process, transform the position data from the first coordinate system to a second coordinate system to generate transformed position data, and associate the transformed position data with the metrology data; and
a data store operable to store the metrology data and the associated transformed position data.

12. The system of claim 11, further comprising an equipment interface operable to receive the metrology data from the metrology tool and generate the metrology report.

13. The system of claim 11, further comprising a process controller operable to control a process based on the metrology data and the associated transformed position data.

14. The system of claim 11, wherein the context data includes a metrology tool identifier.

15. The system of claim 11, wherein the context data includes a recipe identifier associated with a recipe used by the metrology tool to collect the metrology data.

16. The system of claim 11, wherein the coordinate transformation unit is operable to identify parameters of the first coordinate system, the parameters comprising at least one of a notch direction parameter, a rotation parameter, a flip parameter, a transpose parameter, and an offset parameter.

17. The system of claim 11, wherein the metrology report is associated with a semiconductor wafer, and the coordinate transformation unit is operable to identify a mask set associated with the semiconductor wafer, determine a wafer map associated with the mask set, the wafer map defining a plurality of flash sites and a plurality die locations within each flash sites, determine a flash site from the plurality of flash sites including the transformed position data, and determine a die location from the plurality of die locations including the transformed position data.

18. The system of claim 11, wherein the coordinate transformation unit is operable to transpose X and Y coordinates of the first coordinate system.

19. The system of claim 11, wherein the coordinate transformation unit is operable to add an offset to at least one of an X coordinate and a Y coordinate of the first coordinate system.

20. The system of claim 11, wherein the coordinate transformation unit is operable to flip at least one of an X coordinate and a Y coordinate of the first coordinate system.

21. The system of claim 11, wherein the coordinate transformation unit is operable to rotate the first coordinate system.

22. A system, comprising:
means for receiving a metrology report including metrology data collected by a metrology tool, position data associated with the metrology data, and context data associated with the metrology tool and identifying a type of metrology process employed by the metrology tool;
means for determining a first coordinate system employed by the metrology tool based on the context data by accessing a database storing a plurality of coordinate systems indexed by the type of metrology process;
means for transforming the position data from the first coordinate system to a second coordinate system to generate transformed position data; and
means for storing the transformed position data and the metrology data in a data store and associating the transformed position data with the metrology data.

* * * * *